(12) United States Patent
Dosho et al.

(10) Patent No.: US 7,298,219 B2
(45) Date of Patent: Nov. 20, 2007

(54) PHASE-LOCKED LOOP CIRCUIT

(75) Inventors: Shiro Dosho, Osaka (JP); Takashi Morie, Osaka (JP); Kouji Okamoto, Osaka (JP); Yuji Yamada, Osaka (JP); Kazuaki Sogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 11/269,742

(22) Filed: Nov. 9, 2005

(65) Prior Publication Data
US 2006/0139106 A1   Jun. 29, 2006

(30) Foreign Application Priority Data
Dec. 24, 2004   (JP) ............... 2004-374265

(51) Int. Cl.
*H03L 7/00*   (2006.01)
*H03L 1/02*   (2006.01)
(52) U.S. Cl. .............. 331/16; 331/17; 331/25; 331/34; 331/44; 331/176; 327/157
(58) Field of Classification Search ............ 331/8, 331/14, 16, 17, 18, 25, 34, 1 A, 44, 66, 175, 331/176, 177 R; 327/156, 157
See application file for complete search history.

(56) References Cited

U.S. PATENT DOCUMENTS

| | | | |
|---|---|---|---|
| 4,469,082 A | * | 9/1984 | Nishitoba et al. ........... 123/609 |
| 4,595,886 A | | 6/1986 | Mroch et al. |
| 5,389,899 A | * | 2/1995 | Yahagi et al. ................. 331/10 |
| 6,023,185 A | * | 2/2000 | Galipeau et al. ............ 327/513 |
| 6,466,100 B2 | | 10/2002 | Mullgrav, Jr. et al. |
| 6,552,618 B2 | * | 4/2003 | Nelson et al. ................ 331/11 |
| 6,686,804 B1 | * | 2/2004 | Adams et al. ................ 331/17 |

OTHER PUBLICATIONS

Michael H. Perrott, et al., "A Modeling Approach for Σ- Δ Fractional- N Frequency Synthesizers Allowing Straightforward Noise Analysis," IEEE Journal of Solid-State Circuits, Aug. 2002, pp. 1028-1038, vol. 37, No. 8, IEEE.

* cited by examiner

*Primary Examiner*—Robert Pascal
*Assistant Examiner*—Ryan J Johnson
(74) *Attorney, Agent, or Firm*—McDermott Will & Emery LLP

(57) ABSTRACT

The phase-locked loop circuit includes a gain setting circuit for setting a gain of a voltage controlled oscillator, and a time-constant setting circuit for setting a time constant, which is determined by the amount of current in a charge pump circuit and a capacitance value of a loop filter. The gain setting circuit sets the gain to a predetermined value, and the time-constant setting circuit sets the time constant to a predetermined value, whereby the loop band width of the phase-locked loop circuit is set to a desired value.

3 Claims, 10 Drawing Sheets

PHASE-LOCKED LOOP CIRCUIT

CROSS-REFERENCE TO RELATED APPLICATION

This Non-provisional application claims priority under 35 U.S.C. §119(a) on Patent Application No. 2004-374265 filed in Japan on Dec. 24, 2004, the entire contents of which are hereby incorporated by reference.

BACKGROUND OF THE INVENTION

The present invention relates to phase-locked loop circuits, and more particularly relates to technology for controlling the loop band width of a phase-locked loop circuit. A phase-locked loop circuit (which will be hereinafter also called a frequency synthesizer) is essential for an integrated circuit, and recent developments in radio communication have provided significant improvements in phase-locked loop circuits. Among others, a frequency synthesizer, in which sigma-delta modulation technique is applied to a frequency divider, (which will be hereinafter referred to as a "sigma-delta modulation frequency synthesizer") has a large response time-constant, and is thus capable of responding quickly. In addition, sigma-delta modulation frequency synthesizers are capable of achieving very fine frequency resolution.

FIG. 11 illustrates the configuration of a sigma-delta modulation frequency synthesizer. Unlike a frequency divider in a typical phase-locked loop circuit, a frequency divider 50 (a dual modulus prescaler) in this sigma-delta modulation frequency synthesizer does not have a fixed frequency dividing ratio, and includes at least two frequency dividers (frequency dividers 51 and 52 in this example). When a sigma-delta modulator 100 uses the frequency dividers 51 and 52, the sigma-delta modulator 100 switches the frequency dividers 51 and 52 at a frequency higher than the loop band width. The oscillation frequency of the synthesizer is therefore determined by the use rates of the frequency dividers 51 and 52. For example, if the frequency divider 51, having a frequency dividing ratio of N+1, is used at a rate of 50%, and the frequency divider 52, having a frequency dividing ratio of N, is used at a rate of 50%, the oscillation frequency of the synthesizer is (N+½) times the frequency of input signal.

When the sigma-delta modulation frequency synthesizer switches the frequency dividers, switching noise is produced. However, by switching the frequency dividers at a high frequency and by performing sigma-delta modulation, the frequency components of the switching noise are centered in the high frequency region and removed by a loop filter 30, whereby the phase noise characteristics are improved. The frequency dividing ratio of the sigma-delta modulation frequency synthesizer is as low as about N, which allows the synthesizer to have a higher response frequency than a typical frequency synthesizer having a frequency dividing ratio of about the square of N.

In order to optimize the phase noise characteristics of a sigma-delta modulation frequency synthesizer, the loop band width thereof must be optimized. FIG. 12 is a graph indicating the switching noise characteristics of a sigma-delta modulation frequency synthesizer. The sigma-delta modulation frequency synthesizer's response shows low-pass filter characteristics to switching noise. Therefore, as the response frequency becomes lower, that is, the loop band width becomes lower, the switching noise is reduced further. FIG. 13 is a graph indicating the phase noise characteristics of the sigma-delta modulation frequency synthesizer. The sigma-delta modulation frequency synthesizer's response shows high-pass filter characteristics to VCO phase noise. Therefore, in order to reduce the VCO phase noise, the response frequency needs to be set high. As can be seen from the figures, since there is a trade-off between the switching noise and the VCO phase noise, the loop band width must be selected carefully so as to minimize the total amount of switching noise and VCO phase noise.

Nevertheless, so far there is no disclosed method for precisely optimizing the response characteristics of a phase-locked loop circuit, and there have only been techniques for partially controlling characteristics of a voltage controlled oscillator, etc. Under these circumstances, it might be difficult to enhance the performance of future sigma-delta modulation frequency synthesizers, etc.

SUMMARY OF THE INVENTION

In view of the above problem, it is therefore an object of the present invention to control the loop band width of a phase-locked loop circuit in an optimal manner, thereby enhancing the performance of the phase-locked loop circuit.

In order to achieve the above object, an inventive phase-locked loop circuit includes: a gain setting circuit for setting a gain of a voltage controlled oscillator; and a time-constant setting circuit for setting a time constant, which is determined by the amount of current in a charge pump circuit and a capacitance value of a loop filter.

The phase-locked loop circuit preferably further includes a temperature-compensation circuit for adjusting the amount of current in the charge pump circuit in accordance with temperature changes.

In one embodiment of the present invention, the gain setting circuit includes: a switching section for switching inputs into the voltage controlled oscillator; a gain measurement section for measuring the gain based on a difference between outputs produced from the voltage controlled oscillator in response to a first voltage and a second voltage, respectively, which are input into the voltage controlled oscillator by the switching section; a gain setting section for setting the gain in accordance with a supplied control signal; and a gain control section for generating the control signal based on a difference between the gain measured by the gain measurement section and an expected value.

In another embodiment, the time-constant setting circuit includes: a dummy charge pump circuit for performing push-pull operation in accordance with a first signal and a second signal; a capacitor for receiving a current output from the dummy charge pump circuit; a signal generation section for generating the first and second signals based on a voltage produced in the capacitor; a frequency measurement section for measuring a frequency of either the first or second signal; a current setting section for setting the amount of current in the dummy charge pump circuit and the amount of current in the charge pump circuit in accordance with a supplied control signal; and a current control section for generating the control signal based on a difference between the frequency measured by the frequency measurement section and an expected value.

In this particular embodiment, the phase-locked loop circuit further includes a temperature-compensation circuit for outputting a current which increases in amount according to temperature changes, wherein the current setting section sets the amount of the current in the dummy charge pump circuit and the current in the charge pump circuit based on the current output from the temperature-compensation circuit.

In another embodiment, the temperature-compensation circuit includes: a diode; a resistor connected in series to the diode; and a current mirror circuit for receiving a current passing through the resistor, wherein a constant voltage is applied to the diode and the resistor.

DETAILED DESCRIPTION OF THE INVENTION

Hereinafter, preferred embodiments of the present invention will be described with reference to the accompanying drawings.

Figure 1:
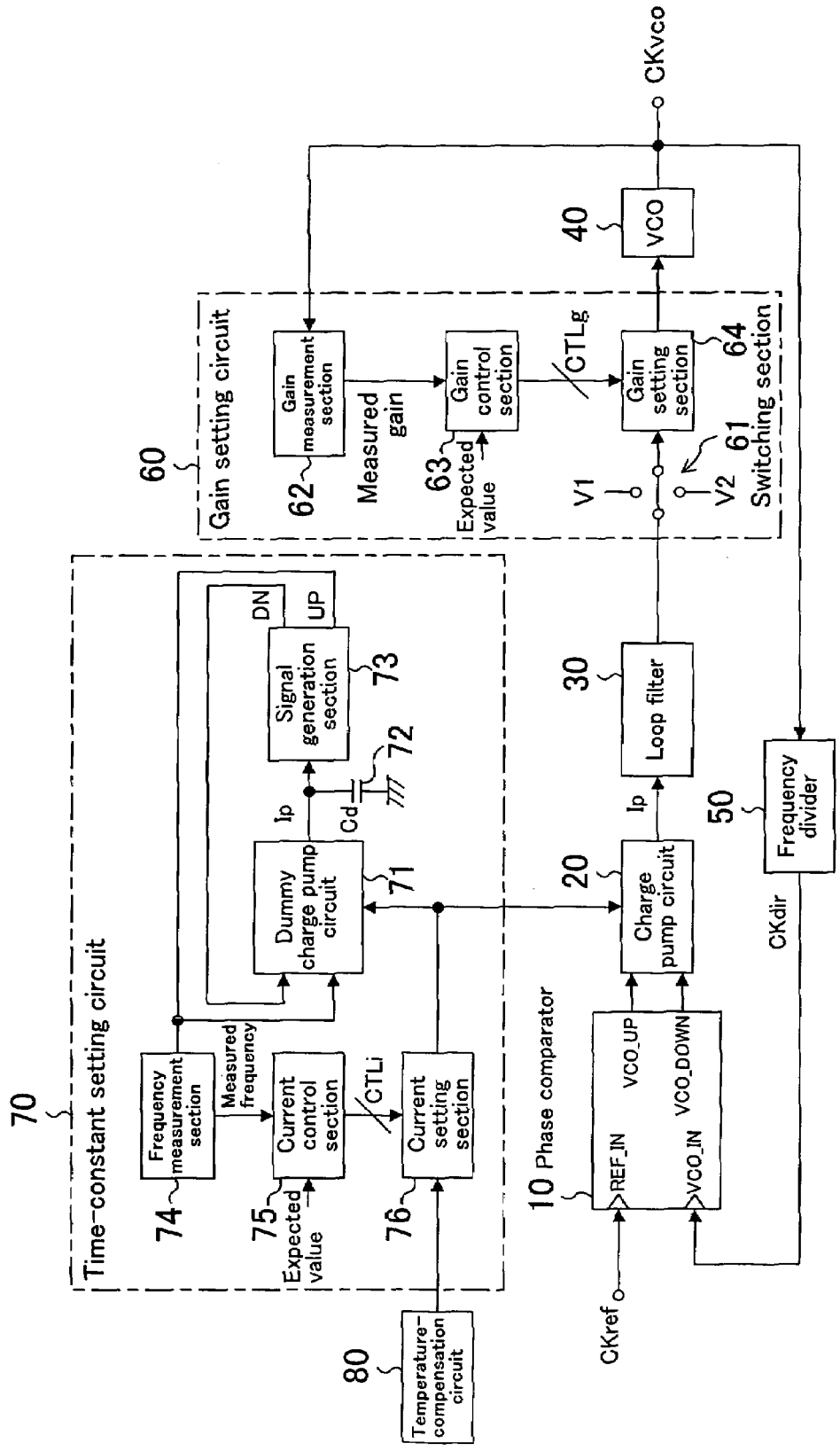
FIG. 1 illustrates the configuration of a phase-locked loop circuit according to an embodiment of the present invention.

FIG. 1 illustrates the configuration of a phase-locked loop circuit according to an embodiment of the present invention. The phase-locked loop circuit of this embodiment includes a phase comparator 10, a charge pump circuit 20, a loop filter 30, a voltage controlled oscillator (which will be hereinafter also called a VCO) 40, a frequency divider 50, a gain setting circuit 60, a time-constant setting circuit 70, and a temperature-compensation circuit 80. The loop band width ωn of the phase-locked loop circuit of this embodiment is substantially expressed by the following equation:

$$\omega n = \sqrt{\frac{KoIp}{2\pi C}}$$

where Ko represents the gain of the VCO 40, Ip represents the amount of current in the charge pump circuit 20, and C represents the capacitance value of the loop filter 30. Therefore, the loop band width ωn of the phase-locked loop circuit can be set to a desired value by setting the gain Ko of the VCO 40 and the time constant Ip/C of the phase-locked loop circuit to certain values. Description will now be made in further detail of the gain setting circuit 60 for setting the gain Ko, the time-constant setting circuit 70 for setting the time constant Ip/C, and the temperature-compensation circuit 80 for compensating for variation in the gain Ko caused by temperature changes.

The gain setting circuit 60 includes a switching section 61, a gain measurement section 62, a gain control section 63, and a gain setting section 64. The switching section 61 selectively inputs one of voltages V1, V2 (V1<V2), and an output from the loop filter 30, to the VCO 40 through the gain setting section 64. The gain measurement section 62 measures the gain of the VCO 40 based on the difference between the outputs produced from the VCO 40 in response to the voltages V1 and V2, respectively, which have been input to the VCO 40 by the switching section 61. The gain control section 63 generates a control signal CTLg based on the difference between the gain measured by the gain measurement section 62 and the gain's expected value to be achieved. The gain setting section 64 sets the gain of the VCO 40 in accordance with the control signal CTLg.

Figure 2:
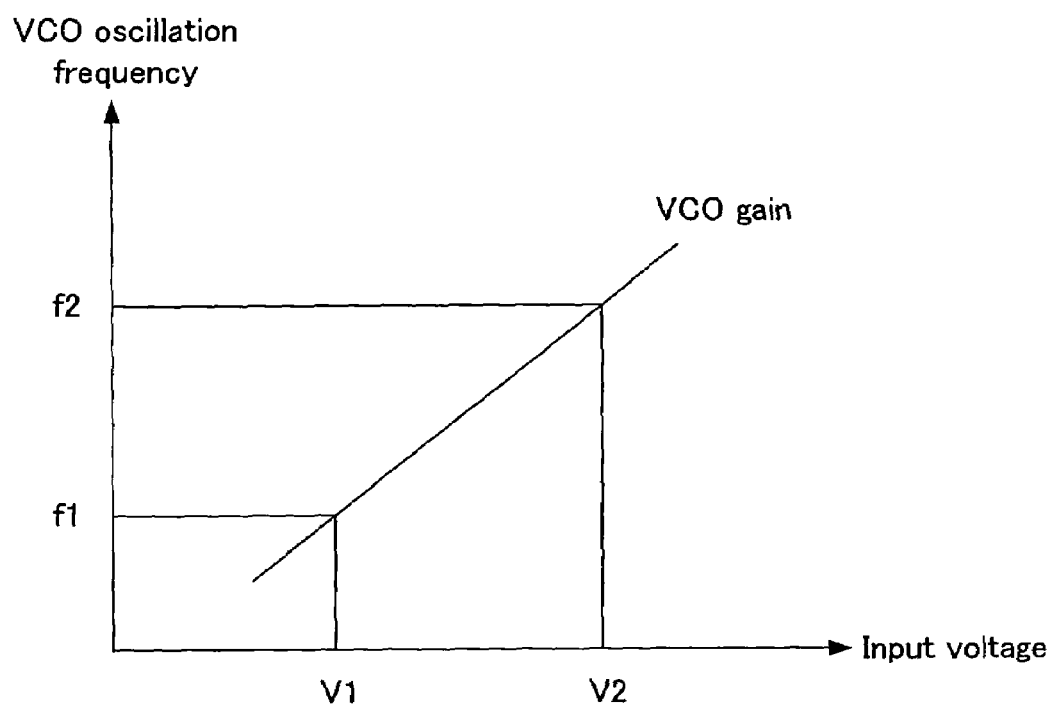
FIG. 2 is a graph indicating the gain characteristics of a voltage controlled oscillator.

FIG. 2 is a graph indicating the gain characteristics of the VCO 40. The gain of the VCO 40 has liner characteristics with respect to voltages output from the loop filter 30, and thus can be measured by inputting two different voltages. Therefore, the gain measurement section 62 measures the gain of the VCO 40 based on the frequencies f1 and f2 of clock signals CKvco output from the VCO 40 in response to the voltages V1 and V2, respectively, which have been input into the VCO 40 by the switching section 61. More specifically, the gain Ko of the VCO 40 is obtained by the equation $$Ko=(f2-f1)/(V2-V1).$$

If the difference between the voltages V1 and V2 is set to unit voltage (V2−V1=1), it is possible to measure the gain Ko by the frequencies f1 and f2 (Ko=f2−f1).

Figure 3:
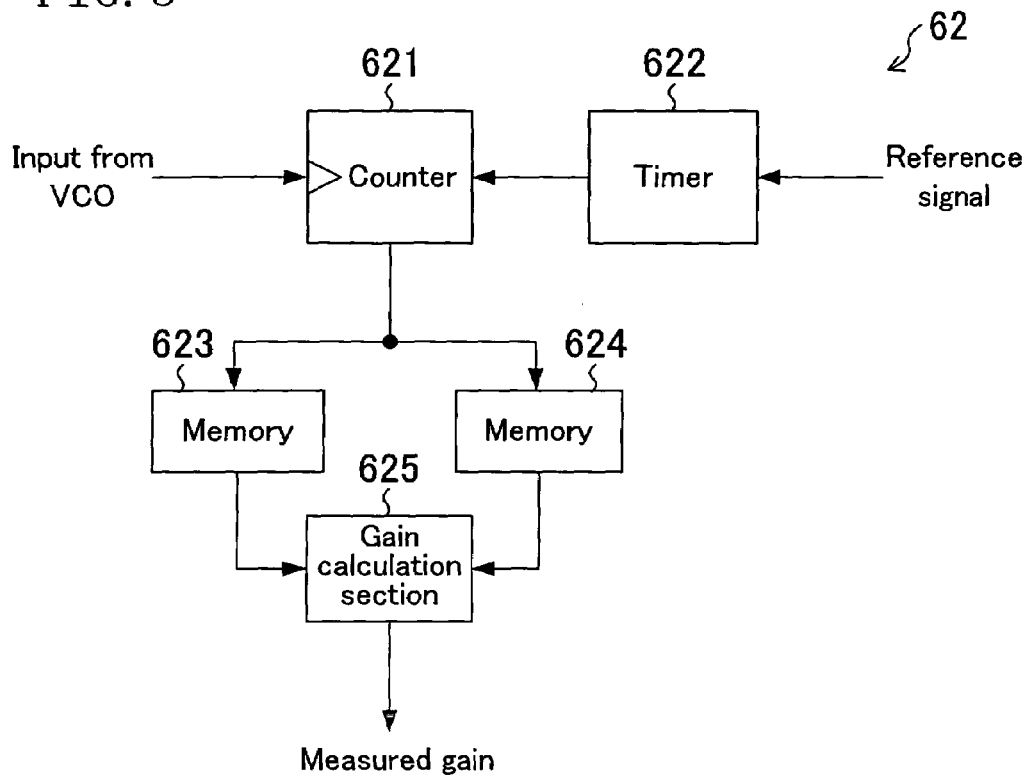
FIG. 3 illustrates a configuration for a gain measurement section.

FIG. 3 illustrates a first exemplary configuration for the gain measurement section 62. A counter 621 counts up pulses of a clock signal CKvco for a certain period of time indicated by a timer 622. The count values obtained when the voltages V1 and V2 are input into the VCO 40 are stored in memories 623 and 624, respectively. A gain calculation section 625 calculates the difference between the count values stored in the memories 623 and 624, and outputs the obtained value as a measured gain.

Figure 4:
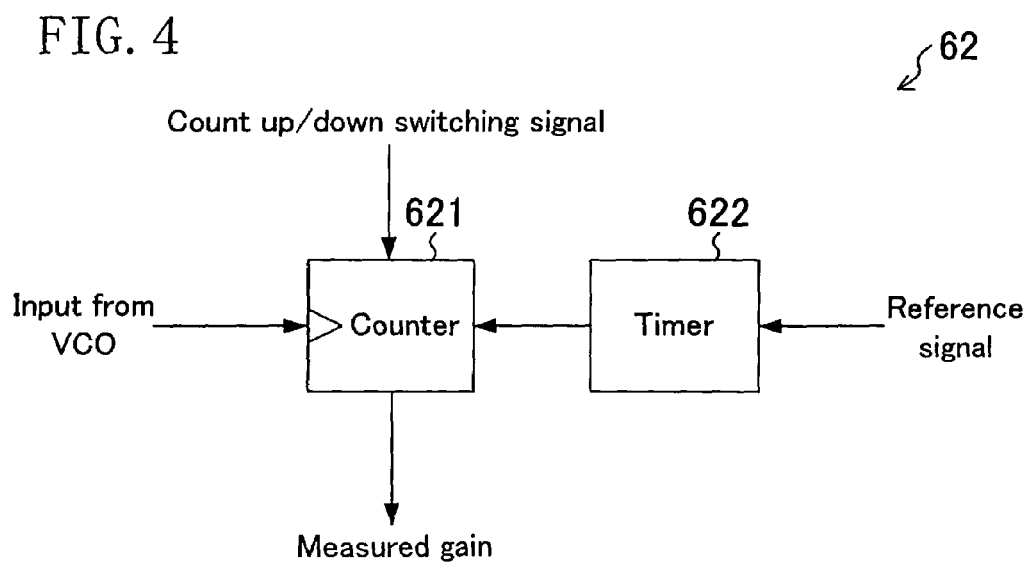
FIG. 4 illustrates another configuration for the gain measurement section.

FIG. 4 illustrates another configuration for the gain measurement section 62. Of the two voltages V1 and V2 input into the VCO 40 by the switching section 61, the voltage that makes the clock signal CKvco have a higher frequency, that is, the voltage V2, is first input into the VCO 40. The counter 621 counts up pulses of the clock signal CKvco for a certain period of time indicated by the timer 622. Then, the voltage V1 is input into the VCO 40 by the switching section 61, at which time the counter 621 is set to countdown mode by a count up/down switching signal so as to count down pulses of the clock signal CKvco for a certain period of time indicated by the timer 622. The count value that the counter 621 holds at the time of completion of the countdown corresponds to the difference between the frequencies f1 and f2. The counter 621 outputs this count value as the measured gain. In this configuration, memories for storing count values and a gain calculation section for calculating a count-value difference are not necessary, which allows the circuit size to be reduced as compared with the first configuration.

Figure 5:
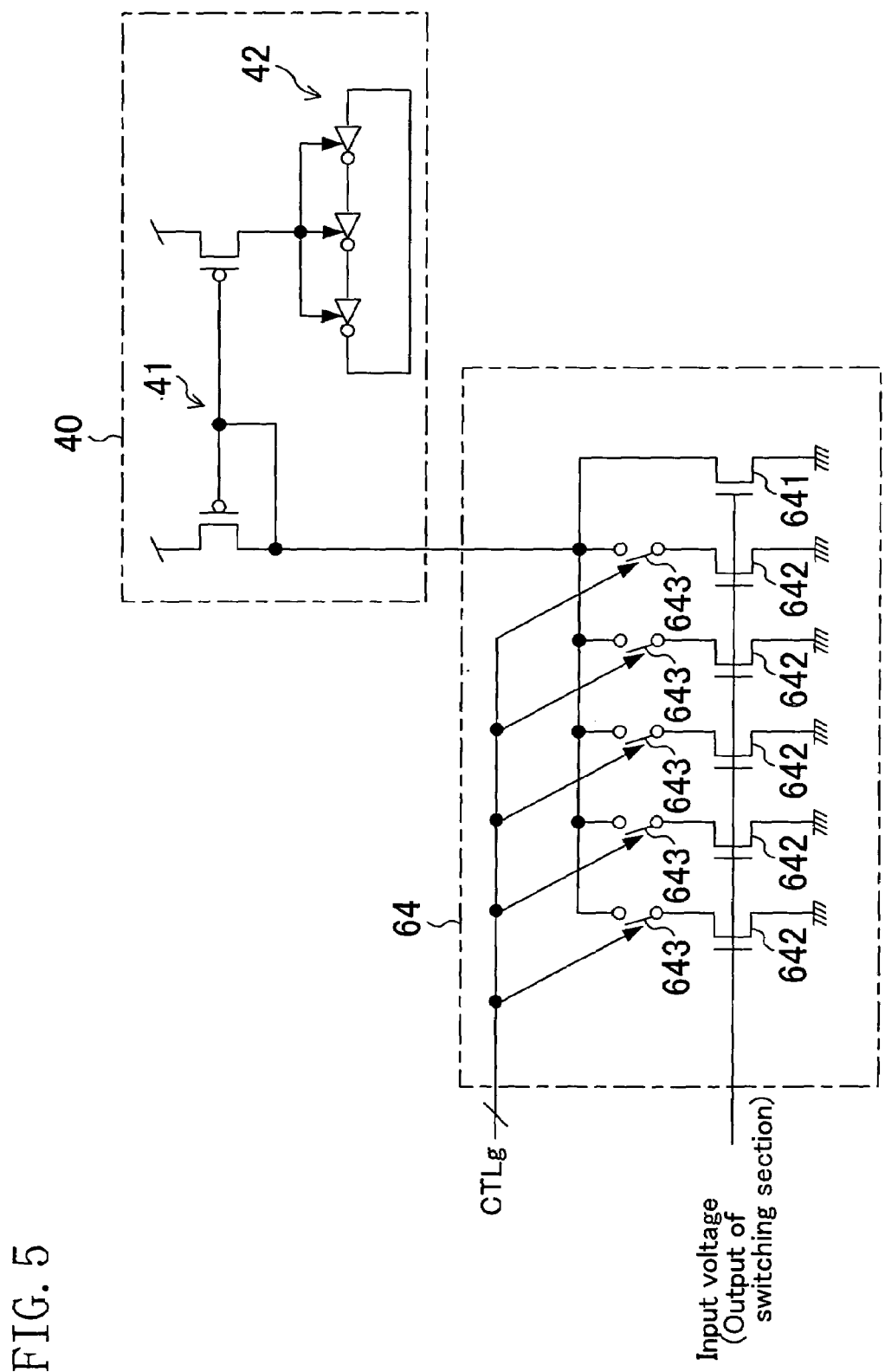
FIG. 5 illustrates the configurations of a gain setting section and the voltage controlled oscillator.

FIG. 5 illustrates the configurations of the gain setting section 64 and the VCO 40. In the VCO 40, a current mirror circuit 41 formed of PMOS transistors performs mirroring of current output from the gain setting section 64 and supplies the obtained current to an inverter chain oscillator 42. Since the amount of current supplied to the inverter chain oscillator 42 is almost proportional to the oscillation frequency, it is possible to control the gain of the VCO 40 by controlling the amount of current output from the gain setting section 64. In the gain setting section 64, five basic units, each composed of an NMOS transistor 642 and a switch 643, are connected in parallel to an NMOS transistor 641, and current is output from the connection point. Output of the switching section 61 is applied, as an input voltage, to the gate of each NMOS transistor 641 and 642. Each switch 643 opens/closes according to a corresponding bit in a control signal CTLg. The NMOS transistors 642 are different in size, and each NMOS transistor 642 has a size that corresponds to the size indicated by the corresponding bit in the control signal CTLg. That is, the gain setting section 64 is capable of performing a 5-bit gain setting, i.e., a 32-step gain setting, for the VCO 40 in accordance with the supplied signal CTLg.

It should be noted that all of the NMOS transistors 642 may have the same size. In that case, a number of NMOS transistors 642 corresponding to the number of steps that can be controlled by the control signal CTLg may be provided, that is 32 NMOS transistors 642 may be provided. Also, the control signal CTLg is not limited to 5 bits, but may have any number of bits. Furthermore, the gain setting section 64 may include PMOS transistors instead of the NMOS transistors.

The gain setting circuit 60 sets the gain of the VCO 40 in the following manner. First, the MSB of the control signal CTLg is set to "1", i.e., the control signal CTLg is set to "0b10000" to set the gain. At this time, if the measured gain is equal to the expected value, the gain setting process is complete. If the measured gain exceeds the expected value, the MSB of the control signal CTLg is set to "0", while a lower bit is set to "1", i.e., the control signal CTLg is set to "0b01000", so as to perform the gain setting again. On the other hand, if the measured gain is smaller than the expected value, a lower bit of the control signal CTLg is set to "1", i.e., the control signal CTLg is set to "0b11000", so as to perform the gain setting again. This process is repeated until the setting of the LSB of the control signal CTLg is performed. In other words, the condition of the gain setting by the gain setting section 64 is determined by binary search. Therefore, the gain Ko of the VCO 40 is set to a predetermined value by performing at most a number of gain comparisons corresponding to the number of bits of the control signal CTLg. In a case in which the measured gain significantly differs from the expected value even after the search process for the LSB of the control signal CTLg has been performed, an overflow or an underflow is detected.

Referring back to FIG. 1, the time-constant setting circuit 70 includes a dummy charge pump circuit 71, a capacitor 72, a signal generation section 73, a frequency measurement section 74, a current control section 75, and a current setting section 76. The dummy charge pump circuit 71 is similar in configuration to the charge pump circuit 20, and performs push-pull operation for current Ip in accordance with signals UP and DN. The capacitor 72 receives the current Ip output from the dummy charge pump circuit 71. The signal generation section 73 generates the signals UP and DN based on the voltage produced in the capacitor 72. The frequency measurement section 74 measures the frequency of the signal UP. The current control section 75 generates a control signal CTLi based on the difference between the frequency measured by the frequency measurement section 74 and a frequency to be achieved. The current setting section 76 sets the amount of current in the dummy charge pump circuit 71 and in the charge pump circuit 20 according to the control signal CTLi.

Figure 6:
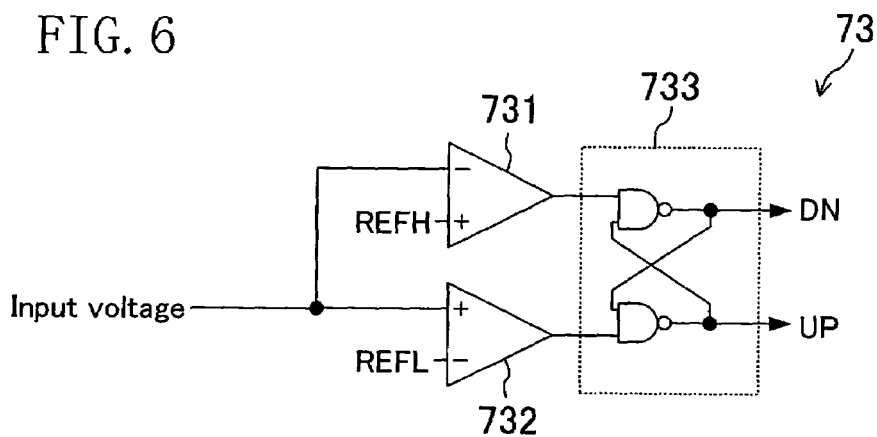
FIG. 6 illustrates the configuration of a signal generation section.

FIG. 6 illustrates the configuration of the signal generation section 73. A comparator 731 compares an input voltage with a voltage REFH and outputs the comparison result. A comparator 732 compares the input voltage with a voltage REFL and outputs the comparison result. Herein, REFL<REFH. An RS flip-flop 733 receives the outputs of the comparators 731 and 732 and outputs the signals UP and DN, which have opposite phases.

Figure 7:
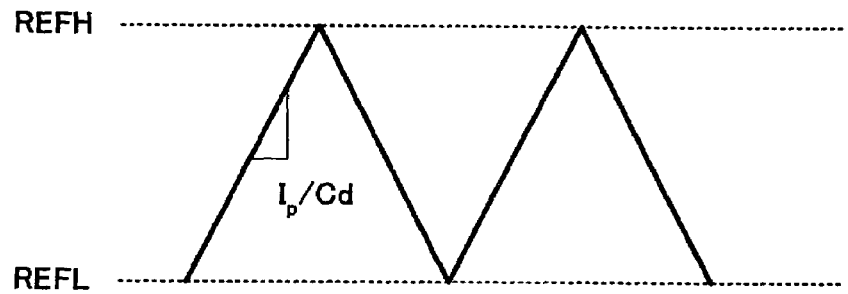
FIG. 7 is a graph indicating change with time in voltage produced in a capacitor in a time-constant setting circuit.

The signals UP and DN generated by the signal generation section 73 are fed back to the dummy charge pump circuit 71. The dummy charge pump circuit 71 performs push-pull operation according to the signals UP and DN, thereby producing a voltage in the capacitor 72. FIG. 7 is a graph indicating change with time in the voltage produced in the capacitor 72. The voltage produced in the capacitor 72 linearly and periodically varies between the voltages REFH and REFL, and the slope of the lines is represented by Ip/Cd, where Cd indicates the capacitance value of the capacitor 72. If it is assumed that the difference between the voltages REFH and REFL is unit voltage (REFH−REFL=1), the frequency f of the signals UP and DN is obtained by the equation $$f=Ip/Cd/2.$$

Therefore, if the current Ip is adjusted so that the frequency f has a predetermined value, Ip/Cd is set to a desired value. In addition, the capacitance value C of the loop filter 30 is a certain multiple of the capacitance value Cd of the capacitor 72 (C=αCd). To set Ip/Cd to a desired value is therefore to set the time constant Ip/C of the phase-locked loop circuit to a desired value.

Figure 8:
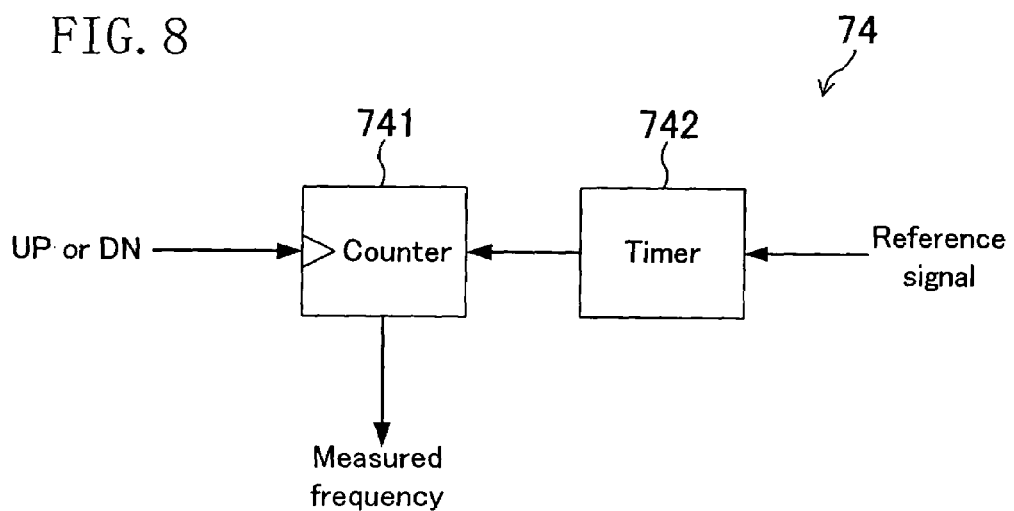
FIG. 8 illustrates the configuration of a frequency measurement section.

FIG. 8 illustrates the configuration of the frequency measurement section 74. A counter 741 counts up pulses of the signal UP or DN (in this embodiment, the signal UP) for a certain period of time indicated by a timer 742, and outputs the count value as a measured frequency.

Figure 9:
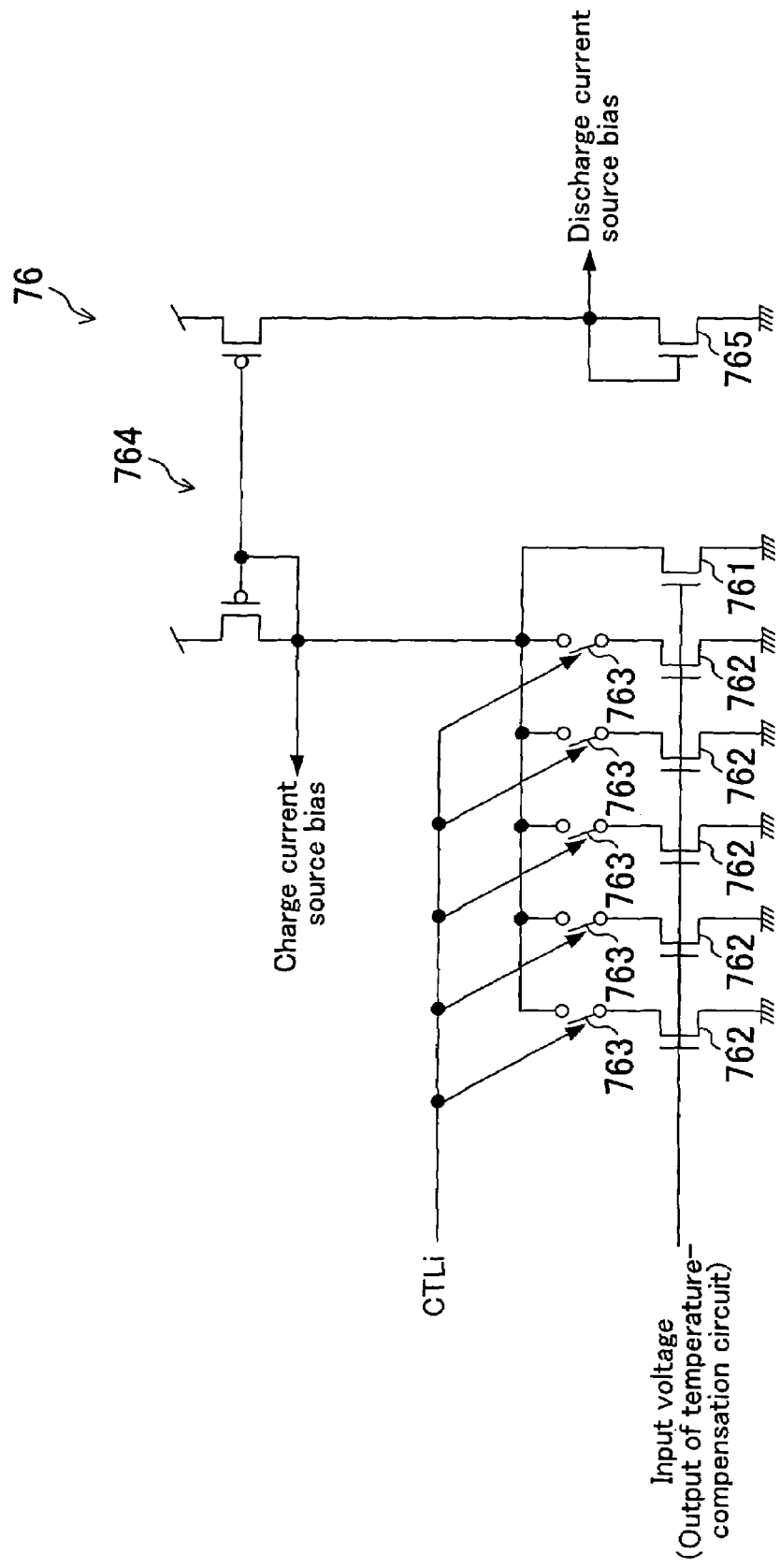
FIG. 9 illustrates the configuration of a current setting section.

FIG. 9 illustrates the configuration of the current setting section 76. In the current setting section 76, five basic units, each composed of an NMOS transistor 762 and a switch 763, are connected in parallel to an NMOS transistor 761. Output of the temperature-compensation circuit 80, which will be described later, is applied, as an input voltage, to the gate of each NMOS transistor 761 and 762. Each switch 763 opens/closes according to a corresponding bit in a control signal CTLi. The NMOS transistors 762 are different in size, and each NMOS transistor 762 has a size corresponding to the size indicated by the corresponding bit in the control signal CTLi.

Current output from the connection point is mirrored by a current mirror circuit 764 formed of PMOS transistors, and the obtained current is supplied to an NMOS transistor 765. The current setting section 76 outputs the voltage produced at the input side of the current mirror circuit 764 and the voltage produced in the NMOS transistor 765 as respective biases to charge current sources and discharge current sources for the dummy charge pump circuit 71 and the charge pump circuit 20. That is, the current setting section 76 is capable of performing a 5-bit current setting, i.e., a 32-step current setting, for the dummy charge pump circuit 71 and the charge pump circuit 20 according to the supplied signal CTLi.

It should be noted that all of the NMOS transistors 762 may have the same size. In that case, a number of NMOS transistors 762 corresponding to the number of steps that can be controlled by the control signal CTLi may be provided, i.e., 32 NMOS transistors 762 may be provided. Also, the control signal CTLi is not limited to 5 bits, but may have any number of bits. Furthermore, the current setting section 76 may include PMOS transistors instead of the NMOS transistors.

Time-constant setting by the time-constant setting circuit 70 is performed in the same manner as the above-described gain setting by the gain setting section 64. More specifically, first, the control signal CTLi is set to "0b10000" so as to set the amount of current in the dummy charge pump circuit 71 and in the charge pump circuit 20. At this time, if the measured frequency is equal to the expected value, the current setting process is complete. If the measured frequency exceeds the expected value, the control signal CTLi is set to "0b01000" so as to perform the current setting again. On the other hand, if the measured frequency is lower than the expected value, the control signal CTLi is set to "0b11000" so as to perform the current setting again. This process is repeated until the setting of the LSB of the control signal CTLi is performed. Therefore, the amount of current in the dummy charge pump circuit 71 and the amount of current in the charge pump circuit 20 are set to predetermined values by performing at most a number of frequency comparisons corresponding to the number of bits of the control signal CTLi. In a case in which the measured frequency significantly differs from the expected value even after the search process for the LSB of the control signal CTLi has been performed, an overflow or an underflow is detected.

If the gain setting and the time-constant setting mentioned above are performed upon start-up of the phase-locked loop circuit, the loop band width is set to the desired value. However, while the phase-locked loop circuit performs normal operation, the switching section 61 selects the output of the loop filter 30 as the input to the VCO 40, such that dynamic gain adjustment cannot be performed. The gain of the VCO 40 decreases particularly when the temperature increases. Therefore, in order to keep the loop band width constant, it is necessary to compensate for variation in the gain of the VCO 40 resulting from temperature changes by using different means. The phase-locked loop circuit of this embodiment therefore includes the temperature-compensation circuit 80.

Figure 10:
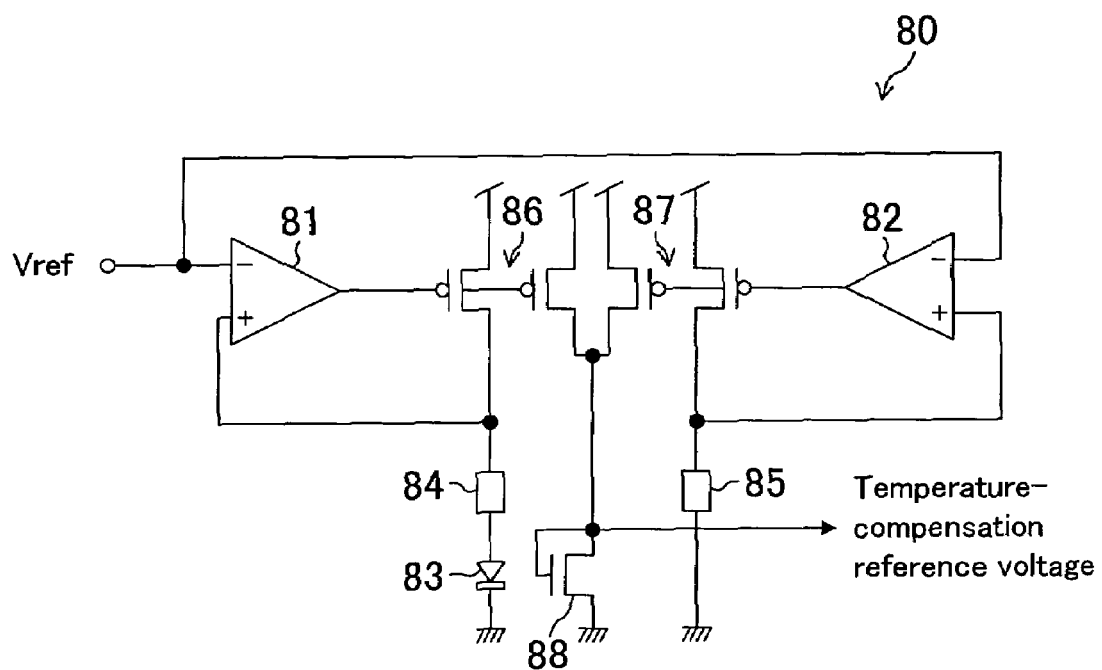
FIG. 10 illustrates the configuration of a temperature-compensation circuit.
Figure 11:
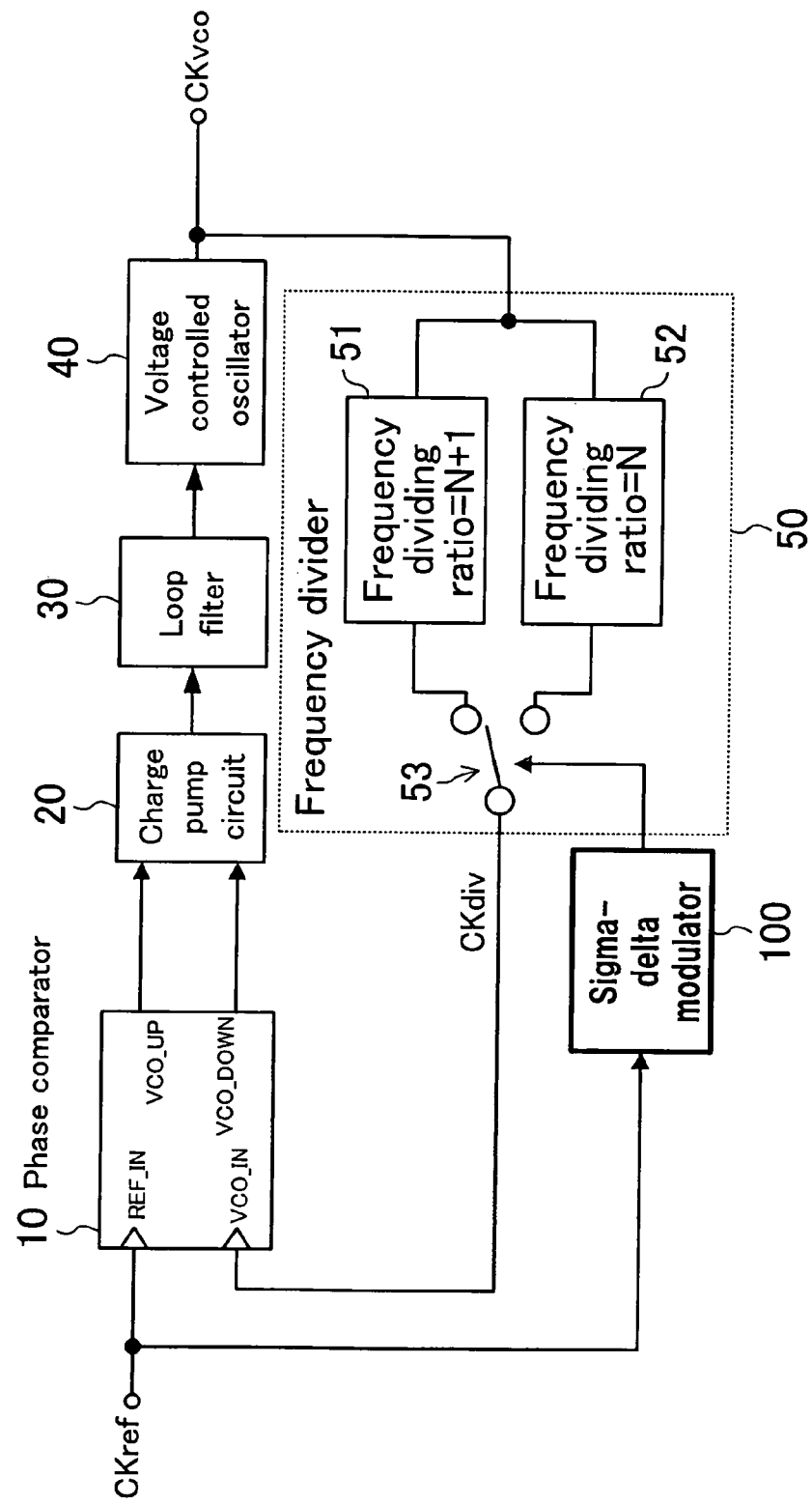
FIG. 11 illustrates the configuration of a sigma-delta modulation frequency synthesizer.
Figure 12:
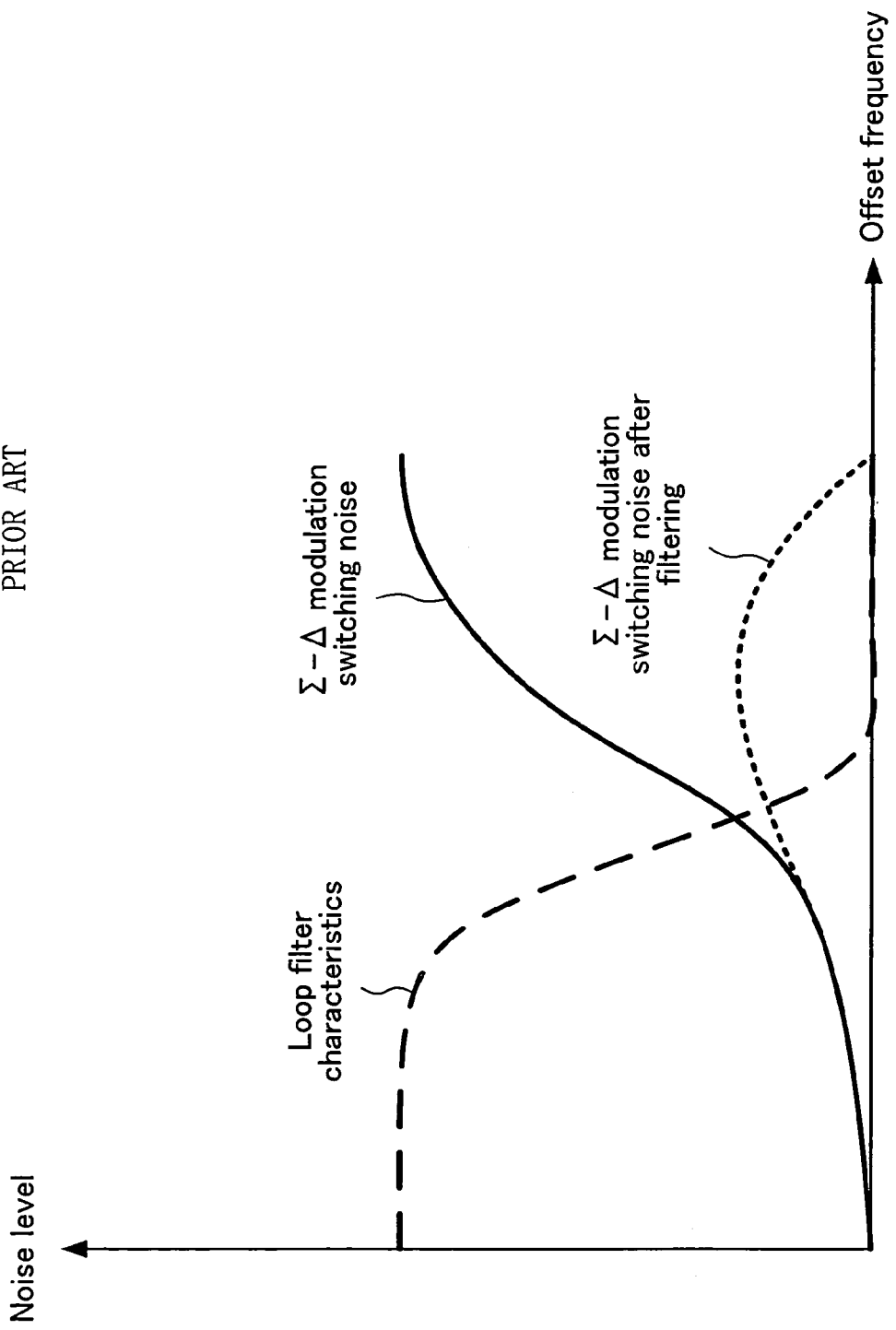
FIG. 12 is a graph indicating the switching noise characteristics of a sigma-delta modulation frequency synthesizer.
Figure 13:
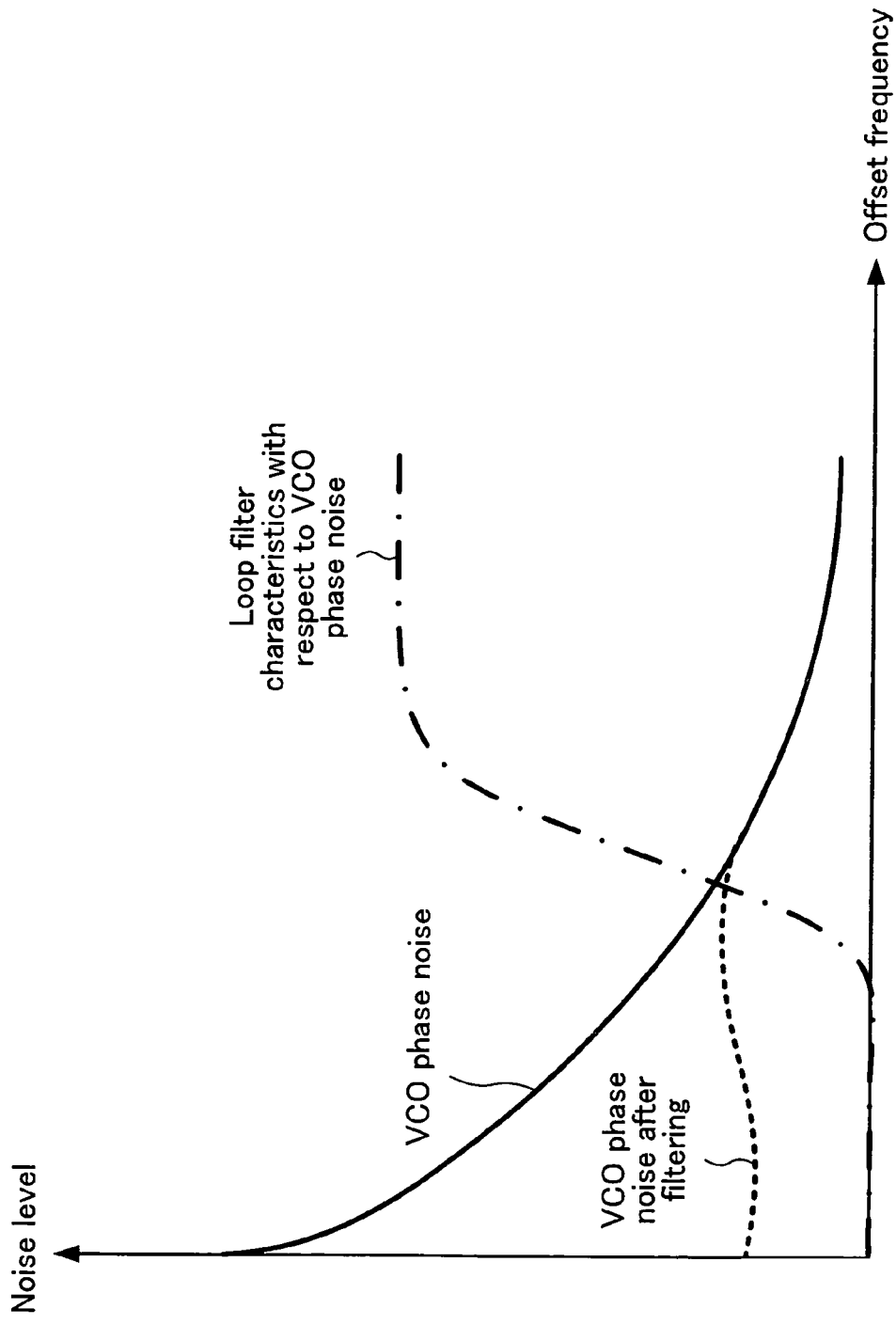
FIG. 13 is a graph indicating the phase noise characteristics of the sigma-delta modulation frequency synthesizer.

FIG. 10 illustrates the configuration of the temperature-compensation circuit 80. In the temperature-compensation circuit 80, a reference voltage Vref is applied to inverting input terminals of operational amplifiers 81 and 82. The operational amplifier 81 applies the reference voltage Vref to a load composed of a diode 83 and a resistor 84 which are connected in series. The operational amplifier 82 applies the reference voltage Vref to a resistor 85. Since the voltage applied to the diode 83 decreases substantially in proportional to temperature changes, the voltage applied to the resistor 84 increases substantially in proportional to the temperature changes. In other words, the current passing through the resistor 84 increases almost in proportional to the temperature changes. On the other hands, variation in the resistance value of the resistor 85 resulting from temperature changes is negligible. It is therefore considered that the current passing through the resistor 85 is constant.

The respective currents passing through the resistors 84 and 85 are mirrored respectively by current mirror circuits 86 and 87, each formed of PMOS transistors. Since the output sides of the current mirror circuits 86 and 87 are connected together, the current obtained by the mirroring of the current passing through the resistor 84 and the current obtained by the mirroring of the current passing through the resistor 85 are added together, and the resultant current is supplied to an NMOS transistor 88. The voltage produced in the NMOS transistor 88 is input, as a temperature compensation reference voltage, into the charge pump circuit 20 and to the dummy charge pump circuit 71 thorough the current setting section 76. In this manner, when the gain of the VCO 40 decreases due to temperature increase, the temperature-compensation circuit 80 compensates for the gain decrease by increasing the amount of current flowing through the charge pump circuit 20.

As described above, in this embodiment, the loop band width of the phase-locked loop circuit is set to an optimal value and the optimal value is kept constant.

The temperature-compensation circuit 80 is not always necessary, and may be provided in cases in which variation in the gain of the VCO 40 caused by temperature changes must be compensated for.

What is claimed is:

1. A phase-locked loop circuit comprising:
   a gain setting circuit for setting a gain of a voltage controlled oscillator; and
   a time-constant setting circuit for setting a time constant, which is determined by the amount of current in a charge pump circuit and a capacitance value of a loop filter,
   wherein the gain setting circuit includes:
   a switching section for switching inputs into the voltage controlled oscillator;
   a gain measurement section for measuring the gain based on a difference between outputs produced from the voltage controlled oscillator in response to a first voltage and a second voltage, respectively, which are input into the voltage controlled oscillator by the switching section;
   a gain setting section for setting the gain in accordance with a supplied control signal; and
   a gain control section for generating the control signal based on a difference between the gain measured by the gain measurement section and an expected value.

2. A phase-locked loop circuit comprising:
   a gain setting circuit for setting a gain of a voltage controlled oscillator; and
   a time-constant setting circuit for setting a time constant, which is determined by the amount of current in a charge pump circuit and a capacitance value of a loop filter,
   wherein the time-constant setting circuit includes:
   a dummy charge pump circuit for performing push-pull operation in accordance with a first signal and a second signal;
   a capacitor for receiving a current output from the dummy charge pump circuit;
   a signal generation section for generating the first and second signals based on a voltage produced in the capacitor;

a frequency measurement section for measuring a frequency of either the first or second signal;
a current setting section for setting the amount of current in the dummy charge pump circuit and the amount of current in the charge pump circuit in accordance with a supplied control signal; and
a current control section for generating the control signal based on a difference between the frequency measured by the frequency measurement section and an expected value.

3. The circuit of claim 2, further comprising a temperature-compensation circuit for outputting a current which increases in amount according to temperature changes,
wherein the current setting section sets the amount of the current in the dummy charge pump circuit and the current in the charge pump circuit based on the current output from the temperature-compensation circuit.

* * * * *